Figure 1:
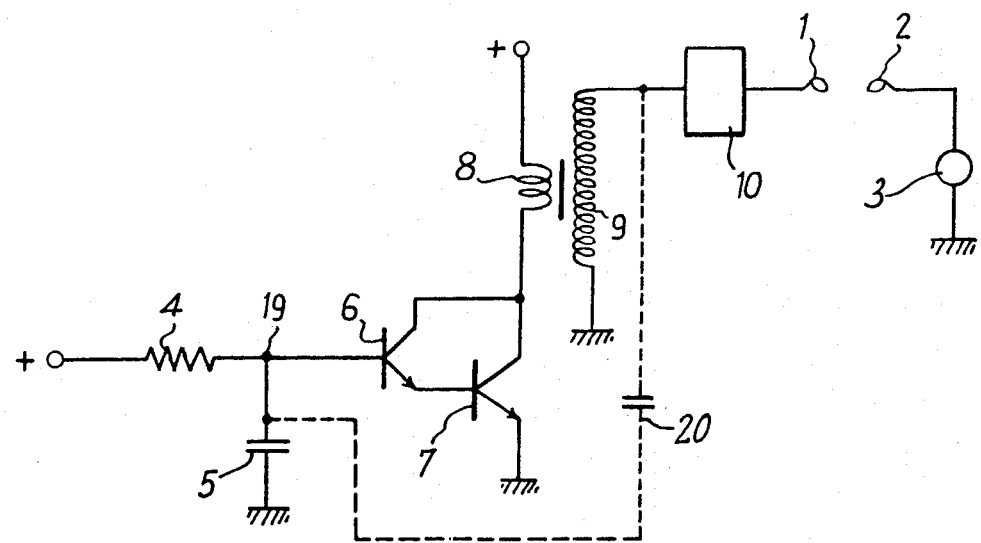

United States Patent [19]

Blanchot et al.

[11] Patent Number: 4,855,889
[45] Date of Patent: Aug. 8, 1989

[54] HIGH-TENSION GENERATOR CIRCUIT WITH VERY LOW CURRENT CONSUMPTION

[75] Inventors: Michele Blanchot, Courbevoie; Daniel Dutertre-Laduree, Bonnieres-Sur-Seine; Rein Roos, Noce, all of France

[73] Assignee: Professional General Electronic Products, France

[21] Appl. No.: 143,497

[22] Filed: Jan. 12, 1988

[30] Foreign Application Priority Data

Jan. 15, 1987 [FR] France .................................. 87 00377

[51] Int. Cl.[4] .......................................... H02M 3/335
[52] U.S. Cl. .......................................... 363/19; 363/97
[58] Field of Search .......................... 363/18, 19–21, 363/60, 61, 97, 131; 323/289

[56] References Cited

U.S. PATENT DOCUMENTS 3,928,793 12/1975 Waltz .................................... 262/19
3,973,220 8/1976 Fender et al. ......................... 363/19
4,757,433 7/1988 Santelmann, Jr. .................... 363/19

OTHER PUBLICATIONS

J. R. Nowicki, "200V from a 5V Logic Line", New Electron (GB), vol. 12, No. 16, Aug. 14, 1979, p. 47.
A. R. Pearlman, "Transistor Power Supply for Geiger Counters", Electronics Aug., 1954, pp. 144–145.

Primary Examiner—Peter S. Wong
Attorney, Agent, or Firm—Darby & Darby

[57] ABSTRACT

High-tension generator circuit for a particle detector, having a transformer (8, 9) and a voltage step-up circuit (10). The primary 8 of the transformer is fed by means of a power transistor 7 whose drive transistor 6 is controlled by means of a resistance-capacitance circuit (4, 5). In each conduction period of the primary the secondary brings about a reversal of the polarity of the capacitance.

14 Claims, 1 Drawing Sheet

HIGH-TENSION GENERATOR CIRCUIT WITH VERY LOW CURRENT CONSUMPTION

The invention relates to a high-tension generator circuit with very low current consumption, for example for particle detectors.

From the document FR-2 561 778 it is known to construct a particle detector operating with a current of the order of the pico-ampere. A detector of this type must have its electrodes subjected to a direct high tension, preferably between 1000 and 400 volts.

One aim of the present invention is to provide a high-tension generator circuit able to supply a voltage of about 1000 to 4000 volts, and which occupies a small space and has a very low current consumption, starting from a polarization voltage of about 10 volts.

The object of the invention is a high-tension generator circuit with very low current consumption, of the type comprising a step-up voltage transformer and, on the secondary side, a voltage step-up circuit, characterized in that the primary of the transformer is fed by means of a power transistor whose drive transistor is controlled by means of a resistance-capacitance circuit, and in that in each conduction period of the primary the secondary brings about a reversal of the polarity of said capacitance.

According to other characteristics of the invention:
the reversal of polarity is effected by coupling;
the coupling is of the capacitive type;
during the conduction periods of the power transistor the current in the primary is of the order of 1 A, while the mean current in the primary is lower than 100 µA;
the duration of the conduction periods of the primary is of the order of the µs, and the time separating two successive conduction periods is of the order of a few ms;
the high tension in the secondary amounts to several thousand volts.

Figure 2:
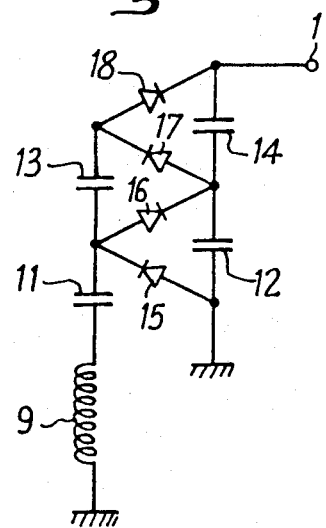

Other characteristics will emerge from the description given below with reference to the accompanying drawings, in which:

FIG. 1 is a diagram of the high-tension generator circuit according to the invention, applied to a particle detector, and FIG. 2 shows one example of construction of a voltage step-up circuit utilizable in the circuit shown in FIG. 1.

Referring to FIG. 1, a particle detector can be seen, which comprises essentially two electrodes 1 and 2, of which one (1) is fed with high tension by the circuit according to the invention, while the other (2) is connected to earth by way of a galvanometer 3. The high-tension generator circuit comprises essentially an RC circuit composed of a resistor 4 and a capacitor 5 in series, two transistors 6, 7, a transformer comprising a primary 8 and a secondary 9, and a voltage step-up circuit 10.

The RC circuit and the primary 8 of the transformer are fed with a polarization voltage of the order of 5 to 20 V. The capacitor 5 is connected to earth. The centre point 19 of the RC circuit is connected to the base of the transistor 6 driving the power transistor 7. The primary of the transformer is connected in series with the power transistor 7. The secondary 9 of the transformer is connected between earth, on the one hand, and the voltage step-up circuit 10, which supplies high tension to the electrode 1, on the other hand.

In one particular example of embodiment the resistor 4 is of the order of 20M Ω, the capacitor 5 of the order of 470 pf, the primary 8 has about 20 turns, and the secondary from 500 to 1000 turns. FIG. 2 shows an example of construction of a voltage step-up circuit 10 of conventional type, comprising capacitors 11, 12, 13, 14 and diodes 15, 16, 17, 18.

In the example of embodiment shown in FIG. 1 the time constant of the RC circuit for charging the capacitor 5 is of the order of a few ms, and the conduction time for strong current (of the order of 1 A) of the transistor 7 is of the order of the µs.

The operation of the high-tension generator circuit can be analyzed as follows: the capacitor 5 is charged for a few ms; the potential of the centre point 19 of the RC circuit, connected to the base of the drive transistor 6, then reaches the conduction threshold of said transistor 6, which becomes conductive and triggers the conduction of the power transistor 7; the transistor 7 starts conducting and the primary 8 of the transformer is fed with current; the primary 8, with its stray capacitance, behaves as an oscillator and a positive current half-wave passes through the primary and the transistor 7; at the end of this half-wave, which lasted about 1 µs, the potential of the collector of the transistor 7 and the base potential of the transistor 7 become negative and the transistor is blocked; during the conduction of the transistor 7 and induced voltage was formed in the secondary 9, its amplitude being dependent on the polarization voltage in the primary and on the ratio of the numbers of turns of the secondary and primary; this voltage is applied to the voltage step-up circuit 10; on the interruption of conduction in the primary, the secondary 9, with its stray capacitance, behaves as an oscillator and a damped oscillating voltage is superimposed on the voltage induced by the primary; the first negative half-wave of this oscillating voltage brings about, through the coupling symbolized at 20—for example capacitive coupling, a reversal of the polarity of the centre point 19 of the RC circuit of the primary, which becomes negative and locks the blocking of the transistors 6 and 7.

The process of charging the capacitor 5 is then repeated for about 10 ms, until the conduction of the transistors of the primary is triggered again for a period of about 1 µs, and so on, thus bringing about the voltage build-up of the electrode 1 and the maintenance of a high voltage on that electrode.

It should be noted that the secondary 9, with its stray capacitance, behaves as a high-frequency oscillator. The oscillation of the secondary is damped by its own resistance, which acts on the amplitude of this oscillation. In addition, the voltage step-up circuit 10 has a leakage current of the order of 1 nA, due essentially to the leakages in the capacitors 11 to 14 and in the diodes 15 to 18. The impedance corresponding to the leakages in this circuit thus affects the amplitude of the voltages generated in the secondary. In addition, the particle detector formed by the electrodes 1,2 and the galvanometer 3 has one special feature: the presence of particles entails a current rise between the electrodes 1 and 2. This current rise in the detector also reduces the amplitude of the voltages generated in the secondary. This has the effect that the negative polarization applied to the point 19 of the primary by the coupling 20 has a lower amplitude. Consequently, the recharge time of the capacitor 5 becomes shorter, and the interval between two conduction periods of the primary also becomes shorter, thus making it possible to maintain the high tension on the electrode 1 at its high level; self-regulation of the high tension is achieved.

The high-tension generator circuit according to the present invention is remarkable for its simplicity, the small space occupied by it (a few cubic centimeters) and its low mean power consumption. Although during the condution periods of the primary the primary current is of the order of 1 A, the mean primary current is in fact of the order of 100 μA. In blocking oscillator high-tension generators of conventional type the mean primary current is of the order of 100 mA, that is to say 1000 times greater.

Finally, the high-tension generator circuit according to the invention makes it possible to have available on the electrode 1 of the particle detector a direct voltage of a value of several thousand volts. The value of this voltage is determined by the value of the polarization voltage of the primary, by the ratio of the numbers of turns in the secondary and in the primary, and by the structure of the voltage step-up circuit 10.

The high-tension generator circuit according to the invention is the more effective, the smaller its dimensions.

It is applicable to apparatus needing a high voltage and having a very low current consumption, for example particle detectors for detecting smokes or gases, vapour detectors (for example for sodium vapour), dust, aerosols, or ions, activated filters for respiratory masks, infrared glasses, or air purifiers, without this list being limitative.

We claim:

1. High-tension generator circuit with very low current consumption, of the type comprising a step-up voltage transformer and, on the secondary side, a voltage step-up circuit, characterized in that the primary of the transformer is fed by means of a power transistor whose drive transistor is controlled by means of a resistance-capacitance circuit, and in that in each conduction period of the primary the secondary brings about a reversal of the polarity of said capacitance.

2. Circuit according to claim 1, characterized in that the reversal of polarity is effected by coupling.

3. Circuit according to claim 1, characterized in that the coupling is of the capacitive type.

4. Circuit according to claim 1, characterized in that during the conduction periods of the power transistor (7) the current in the primary (8) is of the order of 1 A, while the mean current in the primary (8) is lower than 100 μA.

5. Circuit according to claim 4, characterized in that the duration of the conduction periods of the primary is of the order of the μs, and the time separating two successive conduction periods is of the order of a few ms.

6. Circuit according to claim 5, characterized in that the high tension in the secondary amounts to several thousand volts.

7. A high-tension generator circuit comprising:
   means for feeding a primary of a transformer, said feeding means including a drive transistor of a power transistor;
   means for controlling a conductance of said drive transistor, said controlling means including a resistance-capacitance circuit; and
   means for bringing about a reversal in polarity of said capacitance by a secondary of the transformer during each conduction period of the primary.

8. A circuit according to claim 7, wherein said bringing about means includes a capacitive coupling.

9. A circuit according to claim 7, wherein said resistance-capacitance circuit includes a capacitor, further comprising:
   first means for reducing in amplitude voltages generated in the secondary; and
   second means for reducing both a recharge time of said capacitor and an interval between successive conduction periods of the primary, said second means being responsive to said reduction in amplitude of voltages generated in the secondary.

10. A circuit according to claim 7, wherein the primary of the transformer induces voltage in the secondary, the secondary of the transformer having internal resistance and stray capacitance so as to produce damped oscillating voltages superimposed on the voltage induced by the primary, said bringing about means also including means for locking a blocking of the drive transistor and power transistor.

11. A method for generating high-tension, comprising: 'feeding a primary of a transformer through a drive transistor of a power transistor;
   controlling a conductance of the drive transistor with a resistance-capacitance circuit; and
   bringing about a reversal in polarity of the capacitance by a secondary of the transformer during each conduction period of the primary.

12. A method according to claim 11, wherein the step of bringing about includes capacitively coupling between the resistance-capacitance circuit and the secondary.

13. A circuit according to claim 11, wherein the resistance-capacitance circuit includes a capacitor, further comprising:
   first reducing in amplitude voltages generated in the secondary; and
   in response to the step of reducing, further reducing both a recharge time of the capacitor and an interval between successive conduction periods of the primary.

14. A circuit according to claim 11, further comprising the steps of:
   inducing voltage in the secondary by the primary; and
   superimposing damped oscillating voltages of the secondary of the transformer on the voltage induced by the primary, the step of bringing about also including locking a blocking of the drive transistor and power transistor.

* * * * *